United States Patent
Moore

(10) Patent No.: US 7,514,318 B2
(45) Date of Patent: Apr. 7, 2009

(54) METHOD FOR FABRICATING NON-VOLATILE MEMORY CELLS

(75) Inventor: Paul M. Moore, Foster City, CA (US)

(73) Assignee: Micrel, Inc., San Jose, CA (US)

(*) Notice: Subject to any disclaimer, the term of this patent is extended or adjusted under 35 U.S.C. 154(b) by 0 days.

(21) Appl. No.: 12/016,904

(22) Filed: Jan. 18, 2008

(65) Prior Publication Data

US 2008/0108192 A1 May 8, 2008

Related U.S. Application Data

(62) Division of application No. 11/351,520, filed on Feb. 10, 2006, now Pat. No. 7,348,621.

(51) Int. Cl.
*H01L 21/8242* (2006.01)
(52) U.S. Cl. .............. 438/252; 438/250; 438/251; 438/257; 438/262; 438/275; 438/276; 438/279; 438/291; 438/393; 257/295; 257/298; 257/E21.056; 257/E21.137; 257/E21.209; 257/E21.466; 257/E21.642
(58) Field of Classification Search .......... 438/250, 438/251, 252, 262, 393, 257, 275, 276, 279, 438/291; 257/295, 298, E21.056, E21.137, 257/E21.209, E21.466, E21.642
See application file for complete search history.

(56) References Cited

U.S. PATENT DOCUMENTS

| 5,081,052 | A | 1/1992 | Kobayashi et al. |
| 5,766,994 | A | 6/1998 | Tseng |
| 6,025,625 | A | 2/2000 | Chi |
| 6,031,771 | A | 2/2000 | Yiu et al. |
| 6,103,573 | A * | 8/2000 | Harari et al. ............ 438/257 |
| 6,324,097 | B1 | 11/2001 | Chen et al. |
| 6,630,380 | B1 | 10/2003 | Cheng et al. |
| 6,674,119 | B2 | 1/2004 | Hashimoto et al. |
| 6,949,784 | B2 | 9/2005 | Moore |
| 2004/0084705 | A1 | 5/2004 | Moore |

OTHER PUBLICATIONS

Wolf, Stanley, Ph.D., "Silicon Processing for the VLSI Era, vol. 2, Process Integration," Paper, Lattice Press, 1990, pp. 492, 548, and 431 (5 pages total).

* cited by examiner

*Primary Examiner*—Long K Tran
(74) *Attorney, Agent, or Firm*—Sawyer Law Group LLP

(57) ABSTRACT

A method for fabricating non-volatile memory cells is provided. The method includes providing a substrate, forming a first dopant region in the substrate, forming a second dopant region in the first dopant region, growing a first isolation region over a first portion of the substrate, the first dopant region, and the second dopant region, growing a second isolation region over a second portion of the substrate, the first dopant region, and the second dopant region, defining a contact region in the second dopant region, the contact region extending between the first isolation region and the second isolation region, depositing a gate oxide layer to form a first gate dielectric atop the first isolation region and a portion of the contact region, and overlaying a gate conductive layer on top of the gate oxide layer to form a first gate conductor atop the first gate dielectric.

9 Claims, 7 Drawing Sheets

METHOD FOR FABRICATING NON-VOLATILE MEMORY CELLS

CROSS-REFERENCE TO RELATED APPLICATIONS

This application is a divisional of U.S. application Ser. No. 11/351,520, filed on Feb. 10, 2006, now U.S. Pat. No. 7,348,621, which is hereby incorporated by reference in its entirety for all purposes as if fully set forth herein.

FIELD OF THE INVENTION

The present invention relates generally to memory cells. More particularly, the present invention is directed to non-volatile memory cells.

BACKGROUND OF THE INVENTION

Non-volatile memory (e.g., Erasable Programmable Read-Only Memory (EPROM), Electrically Erasable Programmable Read-Only Memory (EEPROM), and flash memory), unlike volatile memory (e.g., read-only memory (RAM)), is capable of preserving information without a power supply. Because non-volatile memory is able to retain data when power is lost, demand for non-volatile memory has increased along with the rise in usage of battery-powered portable electronic devices, such as cellular phones, MP3 players, and digital cameras.

EPROM, EEPROM, and flash memory all utilize floating gate technology in which various methods of gathering charge on the floating gate are employed. For example, Fowler-Nordheim Tunneling (FNT) or Channel Hot Electron (CHE) may be used to surmount the silicon to silicon-dioxide interface. The difference between EPROM, EEPROM, and flash memory lies in how data is erased. An EPROM is usually erased by exposing it to a high dose of UV light, which provides the trapped electrons sufficient energy to escape from the floating gates. Hence, erasing an EPROM requires external equipment and results in deletion of all data stored on it.

In contrast, EEPROM and flash memory can utilize FNT to both write and erase data. Flash memory, however, erases data in chunks (e.g., 512 bytes), rather than 1 cell at a time as in EEPROM. As a result, flash memory has become one of the most popular forms of non-volatile memory since unlike EPROM, it need not be erased in its entirety and does not require external UV equipment for erasure, and unlike EEPROM, it offers much faster erase times.

FIG. 1A shows a circuit diagram of a conventional non-volatile memory cell 100 with a field-effect transistor (FET) 102, a coupling capacitor 104, and a diode 106. FET 102 is coupled to a source terminal 108 and a drain terminal 110. A control terminal 112 is coupled to coupling capacitor 104 and diode 106. In addition, FET 102 and coupling capacitor 104 are coupled to one another.

Illustrated in FIGS. 1B and 1C are cross-sections of FET 102 and coupling capacitor 104 in non-volatile memory cell 100. As shown, FET 102 is an N-type FET comprising a floating gate 114A, a gate dielectric 116A, an N+ source region 118, an N+ drain region 120, N-type lightly-doped drain (NLDD) regions 122, and spacers 124. FET 102 is formed in a P– well 126, which is in a P– substrate 128. Source region 118 and drain region 120 are coupled to source terminal 108 and drain terminal 110, respectively. Isolation regions 130 are formed around FET 102.

Coupling capacitor 104 is an N-type coupling capacitor that comprises an N– well 132 and a control gate 114B separated by a gate dielectric 116B. In FIGS. 1A-1C, floating gate 114A and control gate 114B are electrically coupled using the same conducting trace. An N+ contact region 134 is formed in N– well 132 as a contact for coupling control terminal 112 to coupling capacitor 104. Isolation regions 130 are also formed around coupling capacitor 104. As a result of forming coupling capacitor 104 on P– substrate 128, a PN junction (denoted as diode 106 in FIG. 1A) is formed between P– substrate 128 and N– well 132. To write, read, and erase non-volatile memory cell 100, various voltages can be applied to source terminal 108, drain terminal 110, and control terminal 112 to trap electrons on and remove electrons from floating gate 114A using, for example, FNT.

One drawback of non-volatile memory cell 100 is that when a positive voltage relative to the body of FET 102 is applied to control terminal 112, a depletion region under gate dielectric 116B may form and extend into N– well 132. This decreases the capacitance of coupling capacitor 104 and as a result, higher voltages will need to be applied to write non-volatile memory cell 100.

Another drawback is when source region 118 is positively biased relative to substrate 128 and floating gate 114A, the depletion of NLDD region 122 during erase decreases the electric field appearing across gate dielectric 116A. As a result, a higher voltage will need to be applied at source terminal 108 to achieve FNT from floating gate 114A to source region 118 in order to erase non-volatile memory cell 100.

In addition, the increase in voltage applied may exceed the breakdown voltage (BV) of FET 102. The BV is the voltage at which the junction between the body and the source/drain is subject to an avalanche effect (i.e., when the electric field across the junction is so high that it conducts current via impact ionization), which leads to a breakdown of FET 102. Hence, source region 118 and/or drain region 120 will need to be specially engineered to withstand higher voltages. For example, source region 118 and/or drain region 120 may have to be double-diffused and LDD regions 122 may need to be added (as shown in FIG. 1B). Specially engineered source and/or drain regions, however, not only complicates the fabrication process for non-volatile memory cells, but also slows down programming and erase times of non-volatile memory cells.

Another disadvantage of non-volatile memory cell 100 is that control terminal 112 must be kept more positive than substrate 128 to reverse bias diode 106. If the junction between N– well 132 and P– substrate 128 is forward biased, a substrate current will flow and affect the operation of non-volatile memory cell 100. Therefore, only positive voltages can be applied to control terminal 112 to program non-volatile memory cell 100. As a result, a large voltage must be applied to source terminal 108 or drain terminal 110 to achieve the necessary potential difference with control terminal 112 to erase non-volatile memory cell 100 when control terminal 112 is grounded or kept positive. This, in turn, would also require source region 118 or drain region 120 to be specially engineered with greater breakdown voltage characteristics to withstand large applied voltages.

Accordingly, there is a need for non-volatile memory cells that do not require higher voltages for programming and erasing or specially engineered source and/or drain regions, and have improved programming and erase times. The present invention addresses such a need.

SUMMARY OF THE INVENTION

A non-volatile memory cell is disclosed. The non-volatile memory cell includes a substrate of a first conductivity type, a first dopant region of a second conductivity type in the substrate, a second dopant region of the first conductivity type in the first dopant region, a first isolation region overlaying a first portion of the substrate, the first dopant region, and the second dopant region, a second isolation region overlaying a second portion of the substrate, the first dopant region, and the second dopant region, a contact region of the first conductivity type in the second dopant region, the contact region extending between the first isolation region and the second isolation region and being more heavily doped than the second dopant region, a first gate dielectric atop the first isolation region and a portion of the contact region, and a first gate conductor atop the first gate dielectric.

A method of fabricating a non-volatile memory cell is also provided. The method includes providing a substrate of a first conductivity type, forming a first dopant region of a second conductivity type in the substrate, forming a second dopant region of the first conductivity type in the first dopant region, growing a first isolation region over a first portion of the substrate, the first dopant region, and the second dopant region, growing a second isolation region over a second portion of the substrate, the first dopant region, and the second dopant region, defining a contact region of the first conductivity type in the second dopant region, the contact region extending between the first isolation region and the second isolation region and being more heavily doped than the second dopant region, depositing a gate oxide layer to form a first gate dielectric atop the first isolation region and a portion of the contact region, and overlaying a gate conductive layer on top of the gate oxide layer to form a first gate conductor atop the first gate dielectric.

DETAILED DESCRIPTION

The present invention relates generally to memory cells and more particularly to non-volatile memory cells. The following description is presented to enable one of ordinary skill in the art to make and use the invention and is provided in the context of a patent application and its requirements. Various modifications to the preferred implementations and the generic principles and features described herein will be readily apparent to those skilled in the art. Thus, the present invention is not intended to be limited to the implementations shown, but is to be accorded the widest scope consistent with the principles and features described herein.

Figure 2A:
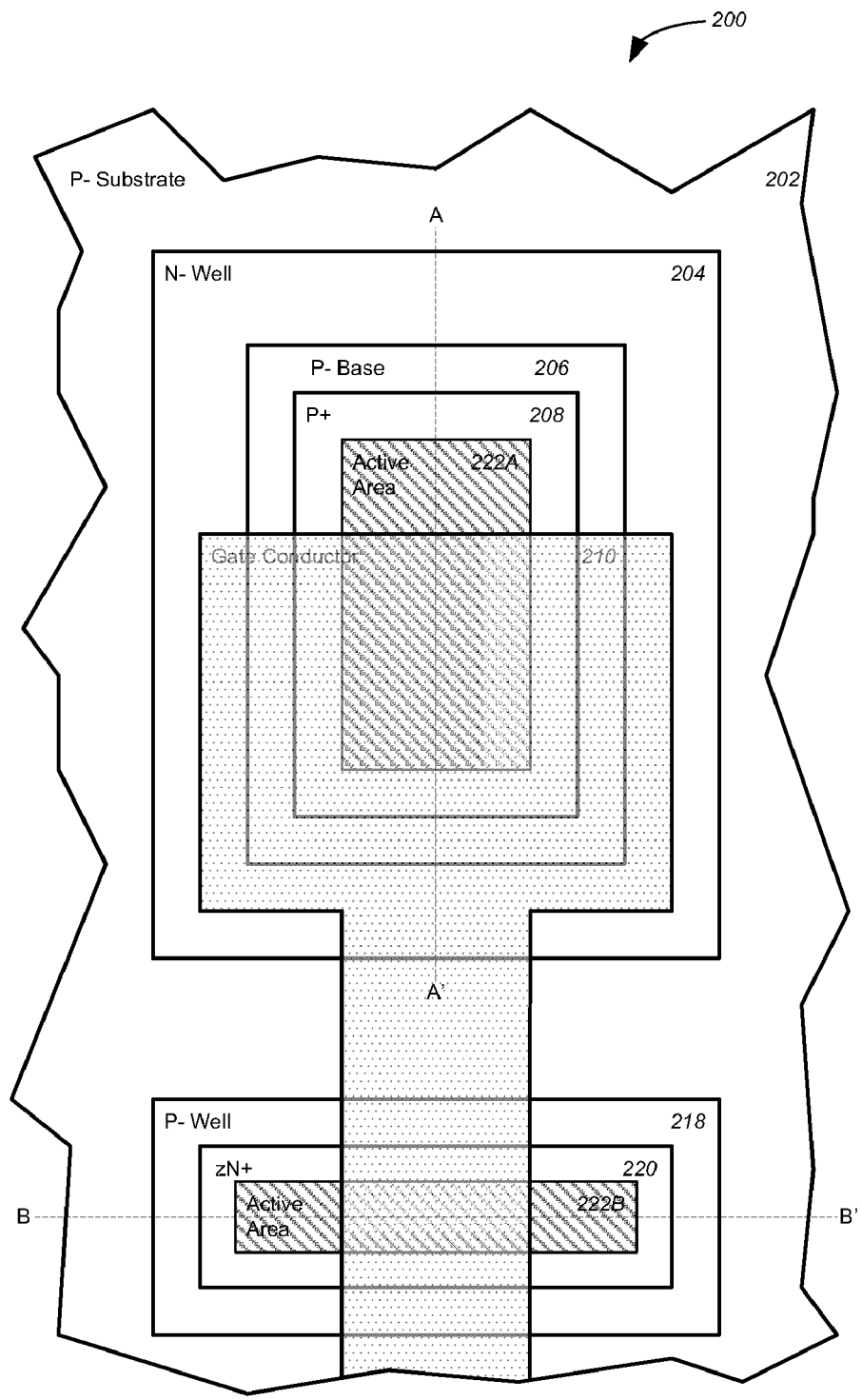
FIG. 2A depicts a top-down view of a non-volatile memory cell according to an embodiment of the invention.

FIG. 2A depicts a top-down view of a non-volatile memory cell 200 in accordance with an embodiment of the invention. Non-volatile memory cell 200 will be described in conjunction with FIGS. 2B-2C, which illustrate cross-sections of non-volatile memory cell 200 taken along line A-A' and line B-B', respectively.

Non-volatile memory cell 200 comprises a P− substrate 202, an N− well 204 in P− substrate 202, a P− base 206 in N− well 204, and a P+ contact region 208 in P− base 206. In the embodiment, P− base 206 is more heavily doped than N− well 204 and P+ contact region 208 is much more heavily doped than P− base 206. Also included in non-volatile memory cell 200 is a P− well 218 in P− substrate 202, a zN+ (i.e., Arsenic only) region 220 in P− well 218 (as seen in FIG. 2A) that forms a source region 220A and a drain region 220B (as seen in FIG. 2C), and spacers 224.

Figure 2B:
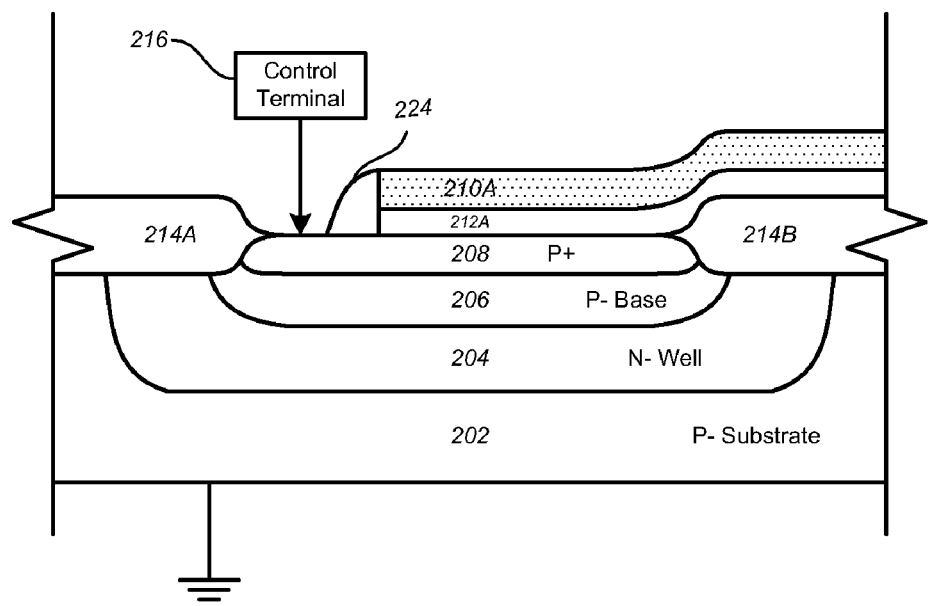
FIG. 2B shows a cross-section of the non-volatile memory cell in FIG. 2A taken along line A-A'.
Figure 2C:
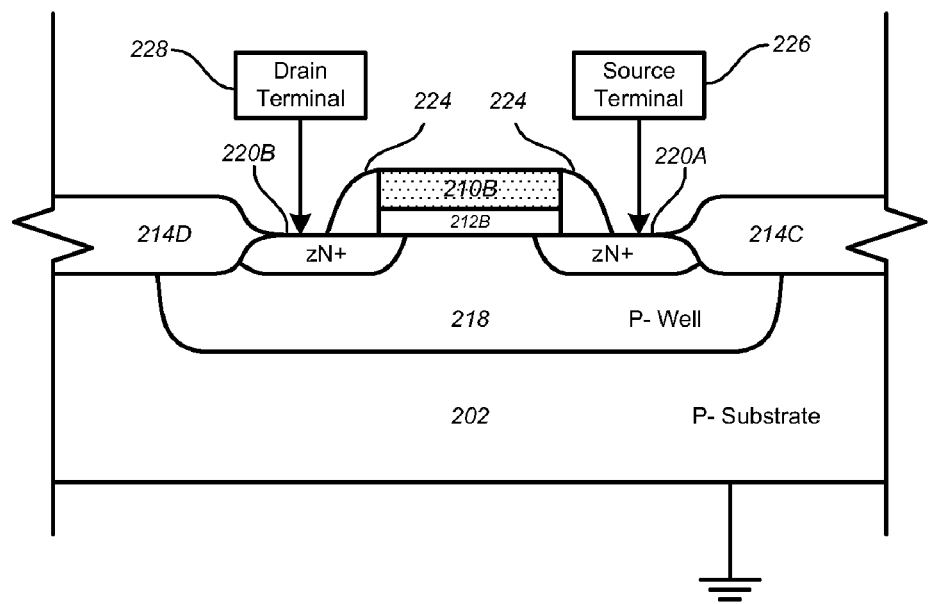
FIG. 2C illustrates a cross-section of the non-volatile memory cell in FIG. 2A taken along line B-B'.

In addition, non-volatile memory cell 200 includes active areas 222A and 222B (as seen in FIG. 2A) that define areas which are surrounded by isolation regions 214A-214D (as seen in FIGS. 2B and 2C), which may be grown using field oxide. As seen in FIG. 2B, P+ contact region 208 extends the length between isolation regions 214A-214B. Non-volatile memory cell 200 further includes a gate conductive layer 210 that forms a first gate conductor (i.e., control gate) 210A and a second gate conductor (i.e., floating gate) 210B. Gate conductive layer 210 is insulated from the body of non-volatile memory cell 200 via a gate oxide layer 212, which forms a first gate dielectric 212A under control gate 210A and a second gate dielectric 212B under floating gate 210B.

A coupling capacitor in non-volatile memory cell 200 is formed in N− well 204 comprising P− base 206, P+ contact region 208, first gate dielectric 212A, and control gate 210A. A field effect transistor (FET) in non-volatile memory cell 200 is formed in P− Well 218 comprising zN+ source region 220A, zN+ drain region 220B, second gate dielectric 212B, and floating gate 210B. The coupling capacitor is electrically coupled to a control terminal 216 and to the field effect transistor since the coupling capacitor and the FET are part of a single conducting trace (i.e., the same layer of polysilicon), which reduces the mask count needed to fabricate non-volatile memory cell 200. The field effect transistor is also electrically coupled to a source terminal 226 and a drain terminal 228 via zN+ source region 220A and zN+ drain region 220B, respectively.

Since non-volatile memory cell 200 comprises a P-type double-diffused coupling capacitor buried in an N-type well, the voltages applied through control terminal 216 can be both positive and negative relative to substrate 202. Thus, the voltages required for programming and erasing non-volatile memory cell 200 can be reduced and as a result, lightly-doped drain (LDD) regions and specially engineered source and/or drain regions are no longer necessary, which simplifies fabrication. In addition, not having LDD regions improves programming and erase times of non-volatile memory cell 200 as LDD regions would inhibit movement of electrons to and from source/drain regions.

For example, if a 12V potential difference between source terminal 226 and control terminal 216 is needed to induce Fowler-Nordheim Tunneling (FNT) to move electrons from zN+ source region 220A to floating gate 210B and vice versa, and the breakdown voltage (BV) of the field effect transistor in non-volatile memory cell 200 is 10V, 6V can be applied to source terminal 226 and −6V can be applied to control terminal 216 to remove electrons from floating gate 210B while leaving zN+ drain region 220B open or floating.

Figure 1B:
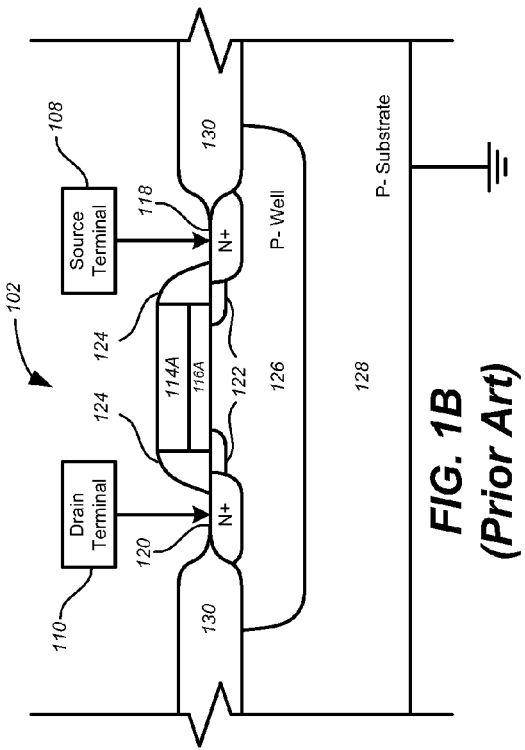
FIGS. 1B and 1C illustrate cross-sections of the conventional non-volatile memory cell in FIG. 1A.
Figure 1C:
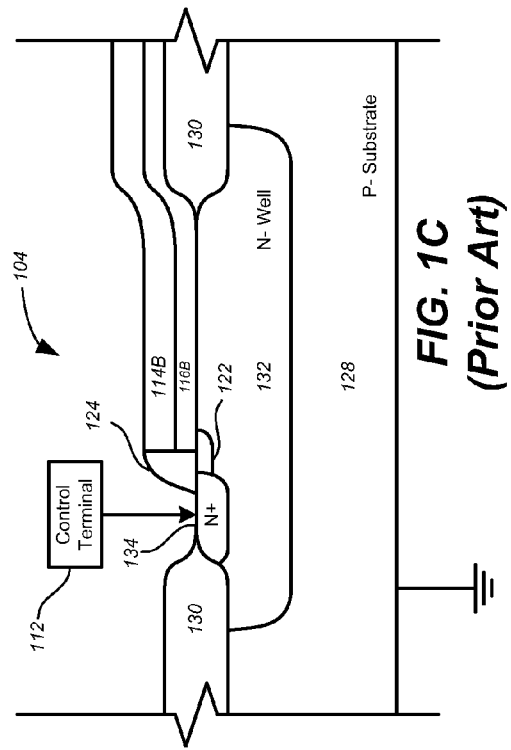
Figure 1A:
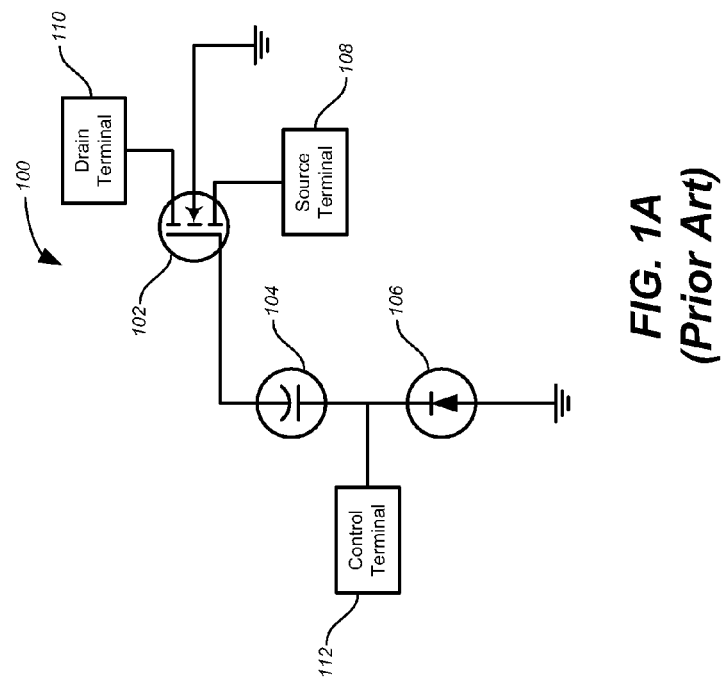
FIG. 1A is a circuit diagram of a conventional non-volatile memory cell.

Additionally, a depletion region under gate dielectric 212A in non-volatile memory cell 200 will not extend as far into P− base 206 as a depletion region under gate dielectric 116B in non-volatile memory cell 100 in FIG. 1C will extend into N− well 132 because P− base 206, in addition to P+ contact region 208, is much more heavily doped than N− well 204. Thus, the capacitance of the coupling capacitor in non-volatile memory cell 200 will not decrease as much as coupling capacitor 104 in non-volatile memory cell 100 in FIG. 1C.

Further, because N− well 204 and P− base 206 are reverse biased, the breakdown voltage of the P+ contact region 208 and P− base 206 is higher than a P+ only region. As a result, the voltage applied to control terminal 216 can be very high.

Non-volatile memory cell 200 also has the benefit of arsenic only source region 220A and drain region 220B. Having only arsenic in source region 220A and drain region 220B encourages hot electrons resulting from the abrupt dopant profile, which will help speed up programming and erasing of non-volatile memory cell 200. Further, because source region 220A and drain region 220B are symmetrical, fabrication of non-volatile memory cell 200 is made easier as the mask count needed is reduced.

Although non-volatile memory cell 200 has been illustrated in FIGS. 2A-2C as including an N-type FET and a P-type double-diffused coupling capacitor buried in an N− well, in other embodiments, non-volatile memory cell 200 may include a P-type FET with an N-type double-diffused coupling capacitor buried in a P− well, an N-type FET with an N-type double-diffused coupling capacitor buried in a P− well, a P-type FET with a P−type double-diffused coupling capacitor buried in an N− well, etc.

In addition, other embodiments of non-volatile memory cell 200 may include an N+ contact region (not shown) in N− well 204 with an additional active area (not shown) within the N+ contact region. Further, although non-volatile memory cell 200 in FIGS. 2A-2C has been depicted without contacts, it is understood that non-volatile memory cell 200 may include one or more contacts in active areas 222A and 222B.

Figure 2D:
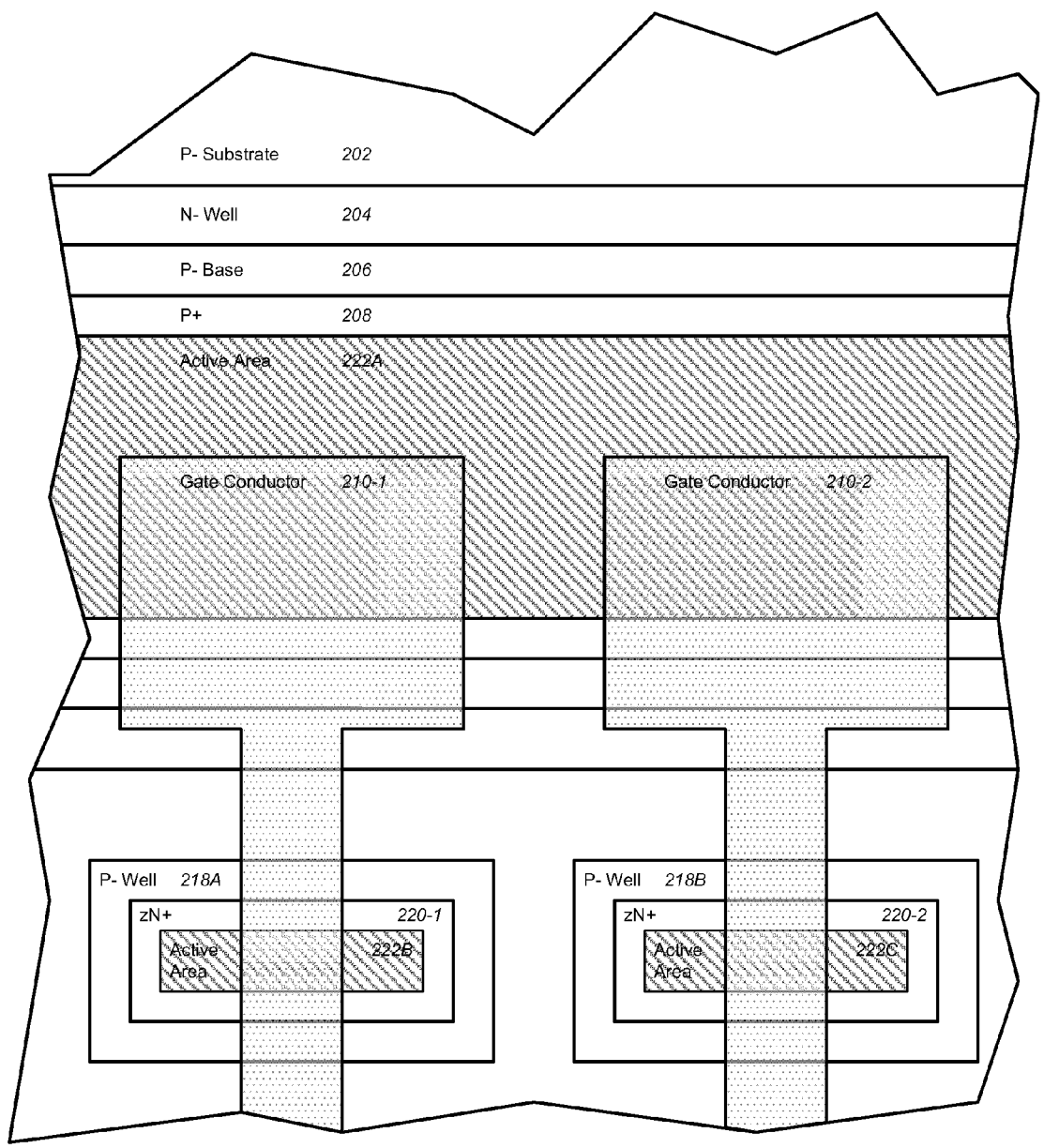
FIGS. 2D-2E depict top-down views of non-volatile memory cells according to other implementations of the invention.

Moreover, N− well 204, P− base 206, P+ contact region 208, and active area 222A may be enlarged in other implementations to allow multiple non-volatile memory cells to be placed in parallel as seen in FIG. 2D. In the embodiment of FIG. 2D, P− substrate 202, N− well 204, P− base 206, P+ contact region 208, and active area 222A have all been extended to accommodate gate conductors 210-1 and 210-2. Additionally, there are now two P− wells 218A and 218B, two zN+ regions 220-1 and 220-2, and two other active areas 222B and 222C.

Figure 2E:
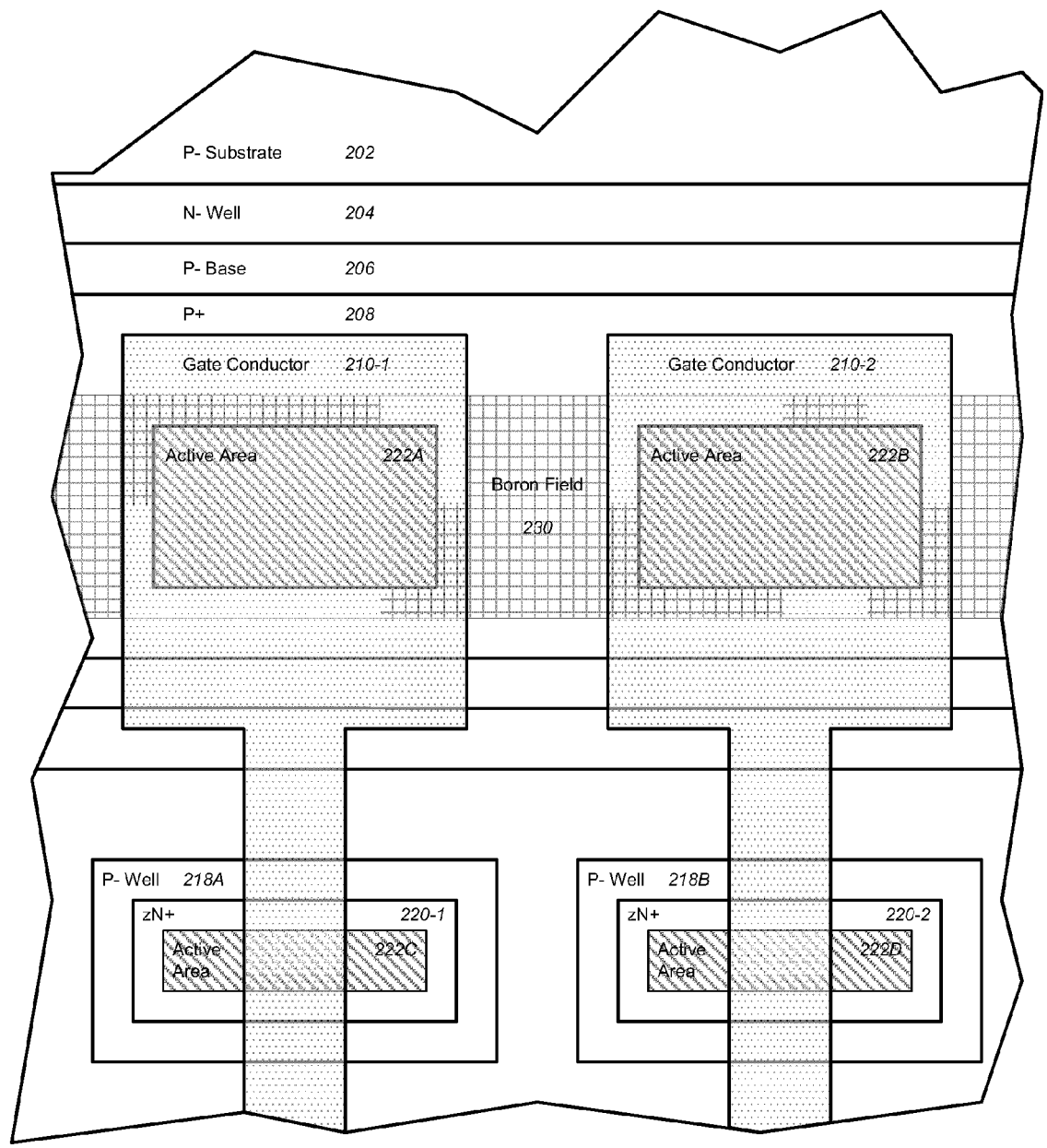

Depicted in FIG. 2E is another embodiment of the present invention. In FIG. 2E, unlike FIG. 2D, rather than having three active areas 222A-222C, there are now four active areas 222A-222D. Further, in contrast to FIG. 2D, P− base 206 and P+ contact region 208 in FIG. 2E are formed before active areas 222A-222D are defined in FIG. 2E. Hence, to address potential issues with defects under isolation regions 214, a boron field 230 (a p-type implant) is used in the embodiment of FIG. 2E to connect P− base 206 and P+ contact region 208 down the word line.

Figure 3:
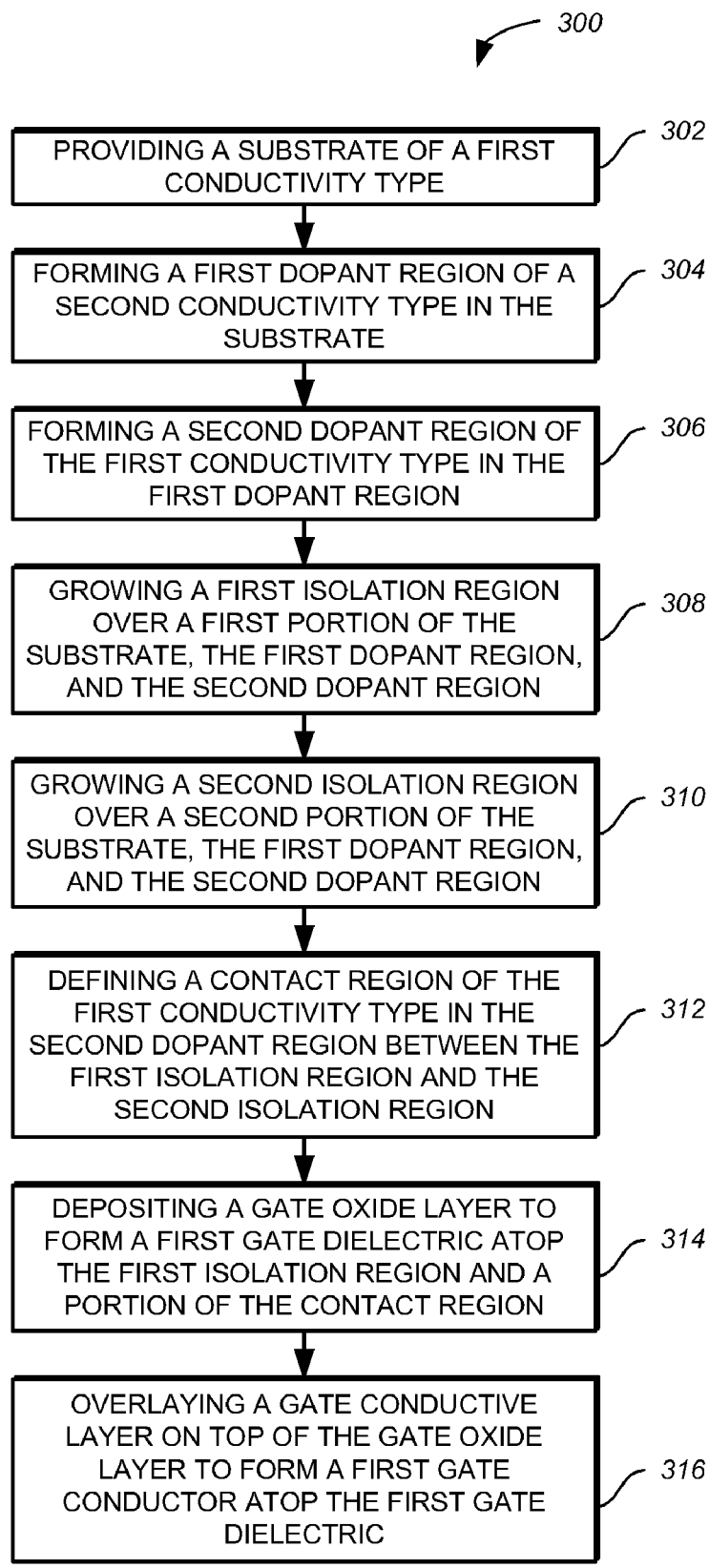
FIG. 3 shows a process flow of a method for fabricating a non-volatile memory cell in accordance with one aspect of the invention.

Shown in FIG. 3 is a process 300 for fabricating a non-volatile memory cell according to one aspect of the invention. At 302, a substrate of a first conductivity type is provided. A first dopant region of a second conductivity type is formed in the substrate at 304. The first dopant region may be formed by patterning and performing ion implantation followed by anneal. The first conductivity type may be a P-type and the second conductivity type may be an N-type or vice versa. In action 306, a second dopant region of the first conductivity type is formed in the first dopant region. The second dopant region may also be formed by ion implantation followed by anneal and may be more heavily doped than the first dopant region.

At 308, a first isolation region is grown over a first portion of the substrate, the first dopant region, and the second dopant region. A second isolation region is grown over a second portion of the substrate, the first dopant region, and the second dopant region at 310. The first and second isolation regions may be grown by thermally treating the substrate in an ambient with moisture and oxygen and growing thick field oxide layers over the substrate.

In action 312, a contact region of the first conductivity type is defined in the second dopant region using, for example, ion implantation followed by anneal. The contact region extends between the first isolation region and the second isolation region and is more heavily doped than the second dopant region. At 314, a gate oxide layer is deposited to form a first gate dielectric atop the first isolation region and a portion of the contact region. The gate oxide layer may be formed through an oxidation process. A gate conductive layer is then overlaid on top of the gate oxide layer to form a first gate conductor atop the first gate dielectric at 316. The gate conductive layer may be a layer of polysilicon and the first gate conductor may be patterned by etching.

Figure 4:
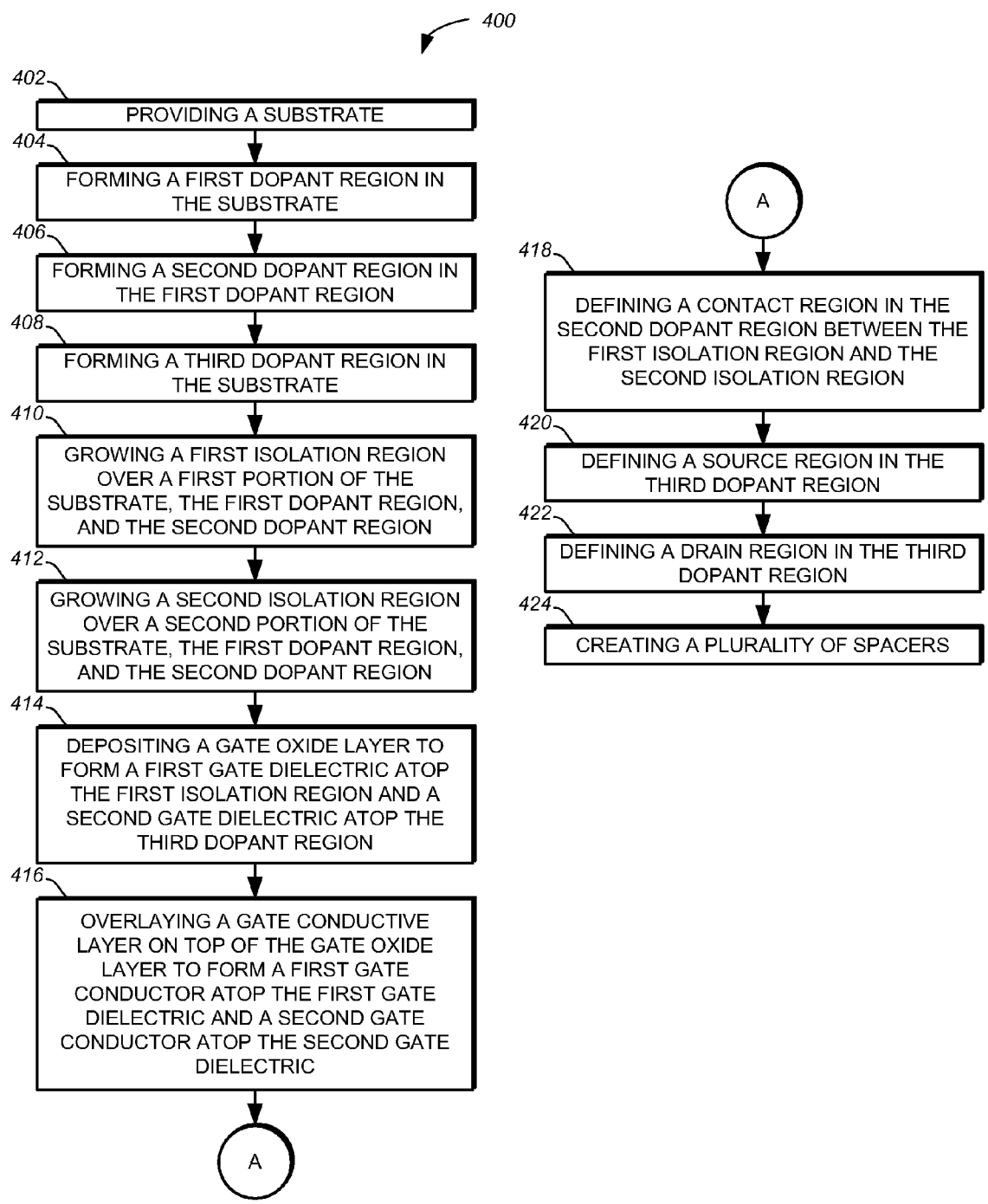
FIG. 4 illustrates a flowchart of a method for fabricating a non-volatile memory cell according to another embodiment of the invention.

FIG. 4 illustrates a process 400 for fabricating a non-volatile memory cell in accordance with another implementation of the invention. A substrate of a first conductivity type is provided at 402. In action 404, a first dopant region of a second conductivity type is formed in the substrate. At 406, a second dopant region of the first conductivity type is formed in the first dopant region. The second dopant region is more heavily doped than the first dopant region in some embodiments of the invention. A third dopant region of the first conductivity type is then formed in the substrate at 408.

At 410, a first isolation region is grown over a first portion of the substrate, the first dopant region, and the second dopant region. In action 412, a second isolation region is grown over a second portion of the substrate, the first dopant region, and the second dopant region. The first and second dopant regions may comprise field oxide.

A layer of gate oxide is deposited at 414 to form a first gate dielectric atop the first isolation region and a second gate dielectric atop the third dopant region. At 416, a gate conductive layer is overlaid on top of the gate oxide layer to form a first gate conductor atop the first gate dielectric and a second gate conductor atop the second gate dielectric. The gate conductive layer may be a layer of polysilicon that is patterned through etching to form the first gate conductor and the second gate conductor.

In action 418, a contact region of the first conductivity type is defined in the second dopant region between the first isolation region and the second isolation region. A source region and a drain region of the second conductivity type are then defined at 420 and 422 in the third dopant region. The contact region, source region, and drain region may be defined using ion implantation followed by anneal.

A plurality of spacers are created at 424. Spacer can be created by deposition of spacer material followed by dry etching. In the embodiment, the plurality of spacers are created after the source and drain regions are defined. By defining the source and drain regions before creation of the spacers, the distance between the second gate conductor and the source and drain regions are reduced and in effect self-aligned. This leads to faster program and erase times for non-volatile memory cells.

Various implementations of a non-volatile memory cell and methods for fabricating the non-volatile memory cell have been described. Nevertheless, one of ordinary skill in the art will readily recognize that various modifications may be made to the implementations, and any variations would be within the spirit and scope of the present invention. For example, the above-described process flow is described with reference to a particular ordering of process actions. However, the ordering of many of the described process actions may be changed without affecting the scope or operation of the invention. Accordingly, many modifications may be made by one of ordinary skill in the art without departing from the spirit and scope of the following claims.

What is claimed is:

1. A method for fabricating a non-volatile memory cell, the method comprising:

providing a substrate of a first conductivity type;

forming a first dopant region of a second conductivity type in the substrate;

forming a second dopant region of the first conductivity type in the first dopant region;

growing a first isolation region over a first portion of the substrate, the first dopant region, and the second dopant region, the first isolation region being in contact with the substrate, the first dopant region, and the second dopant region;

growing a second isolation region over a second portion of the substrate, the first dopant region, and the second dopant region, the second isolation region being in contact with the substrate, the first dopant region, and the second dopant region;

defining a contact region of the first conductivity type in the second dopant region, the contact region extending between the first isolation region and the second isolation region such that the first isolation region and the second isolation region are both in contact with the contact region, the contact region being more heavily doped than the second dopant region;

depositing a gate oxide layer to form a first gate dielectric atop the first isolation region and a portion of the contact region; and overlaying a gate conductive layer on top of the gate oxide layer to form a first gate conductor atop the first gate dielectric.

2. The method of claim 1, further comprising:

forming a third dopant region of the first conductivity type in the substrate, wherein deposition of the gate oxide layer further forms a second gate dielectric atop the third dopant region and overlay of the gate conductive layer further forms a second gate conductor atop the second gate dielectric, the second gate conductor being coupled to the first gate conductor;

defining a source region of the second conductivity type in the third dopant region, the source region being in contact with the second gate dielectric; and defining a drain region of the second conductivity type in the third dopant region, the drain region being in contact with the second gate dielectric.

3. The method of claim 2, wherein the first gate conductor and the second gate conductor comprise part of a single conducting trace.

4. The method of claim 2, wherein the source region and the drain region are symmetrical.

5. The method of claim 2, wherein the source region and the drain region comprise only arsenic.

6. The method of claim 2, further comprising:

creating a plurality of spacers, wherein a first of the plurality of spacers is only in contact with the second gate dielectric, the second gate conductor, and the source region, and a second of the plurality of spacers is only in contact with the second gate dielectric, the second gate conductor, and the drain region.

7. The method of claim 1, wherein the first conductivity type is P-type and the second conductivity type is N-type.

8. The method of claim 1, wherein the second dopant region, the contact region, the first gate dielectric, and the first gate conductor form a coupling capacitor.

9. The method of claim 1, wherein the non-volatile memory cell does not include any lightly-doped drain regions.

* * * * *